(12) United States Patent
Shiraishi et al.

(10) Patent No.: US 10,670,384 B2
(45) Date of Patent: Jun. 2, 2020

(54) CYLINDRICAL TARGET PRODUCTION METHOD AND CYLINDRICAL TARGET

(71) Applicant: SUMITOMO CHEMICAL COMPANY, LIMITED, Tokyo (JP)

(72) Inventors: Mizuki Shiraishi, Tokyo (JP); Takuto Sugawara, Niihama (JP); Koji Nishioka, Osaka (JP); Masahiro Fujita, Niihama (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 16/075,037

(22) PCT Filed: Feb. 2, 2017

(86) PCT No.: PCT/JP2017/003710
§ 371 (c)(1),
(2) Date: Aug. 2, 2018

(87) PCT Pub. No.: WO2017/135349
PCT Pub. Date: Aug. 10, 2017

(65) Prior Publication Data
US 2019/0041183 A1 Feb. 7, 2019

(30) Foreign Application Priority Data
Feb. 5, 2016 (JP) ................... 2016-021212

(51) Int. Cl.
*C23C 14/34* (2006.01)
*G01B 5/28* (2006.01)
*H01J 37/34* (2006.01)

(52) U.S. Cl.
CPC ............ *G01B 5/28* (2013.01); *C23C 14/3407* (2013.01); *C23C 14/3414* (2013.01); *G01B 5/285* (2013.01); *H01J 37/342* (2013.01)

(58) Field of Classification Search
CPC ...................................................... H01J 37/342
See application file for complete search history.

(56) References Cited

U.S. PATENT DOCUMENTS 4,987,046 A * 1/1991 Kutami .................. G03G 5/102
430/127
2005/0050745 A1 3/2005 Akatsuka et al.
(Continued)

FOREIGN PATENT DOCUMENTS

CN 104246003 A 12/2014
CN 105203005 A 12/2015
(Continued)

OTHER PUBLICATIONS

International Search Report, issued in PCT/JP2017/003710, PCT/ISA/210, dated May 9, 2017.
(Continued)

*Primary Examiner* — Jason Berman
(74) *Attorney, Agent, or Firm* — Birch, Stewart, Kolasch & Birch, LLP

(57) ABSTRACT

To provide a process for producing a cylindrical target which has almost no distortion in the longitudinal direction. The process for producing a cylindrical target according to the present invention comprises the steps of: processing a target material into a cylindrical shape; providing an adapter for attachment to a sputtering apparatus, in the target material processed into the cylindrical shape; and measuring a straightness in a longitudinal direction of an appearance of the target material having the adapter to confirm whether the straightness of the target material having the adapter is within a predetermined range.

6 Claims, 4 Drawing Sheets

(56) References Cited

U.S. PATENT DOCUMENTS

| | | |
|---|---|---|
| 2005/0225755 A1 | 10/2005 | Matsutori |
| 2006/0204286 A1* | 9/2006 | Tsubota ............. G03G 15/0818 399/286 |
| 2009/0259435 A1 | 10/2009 | Enomoto et al. |
| 2015/0041313 A1 | 2/2015 | Komiyama |
| 2015/0090587 A1 | 4/2015 | Gartner et al. |
| 2016/0126072 A1 | 5/2016 | Endo |

FOREIGN PATENT DOCUMENTS

| | | |
|---|---|---|
| JP | 6-213617 A | 8/1994 |
| JP | 2003-240503 A | 8/2003 |
| JP | 2004-61111 A | 2/2004 |
| JP | 2004-101465 A | 4/2004 |
| JP | 2004-151091 A | 5/2004 |
| JP | 2007-263895 A | 10/2007 |
| JP | 2010-70842 A | 4/2010 |
| JP | 2012-108143 A | 6/2012 |
| JP | 2012-111994 A | 6/2012 |
| JP | 2013-57112 A | 3/2013 |
| JP | 2013-147368 A | 8/2013 |
| JP | 2013-204052 A | 10/2013 |
| JP | 2014-105383 A | 6/2014 |
| JP | 2015-36448 A | 2/2015 |
| JP | 2015-505901 A | 2/2015 |
| JP | 2015-86447 A | 5/2015 |
| JP | 2016-151043 A | 8/2016 |
| WO | WO 2015/004958 A1 | 1/2015 |
| WO | WO 2016/067717 A1 | 5/2016 |

OTHER PUBLICATIONS

Japanese Decision of Rejection (including an English translation thereof) issued in the corresponding Japanese Patent Application No. 2016-021212 dated Oct. 3, 2017.

Japanese Notice of Reasons for Rejection (including an English translation thereof) issued in the corresponding Japanese Patent Application No. 2017-104724 dated Aug. 8, 2017.

Takeo Chigono, "Introduction of Universal Cylindrical Form Measuring Machine and Attempt of Measurement Accuracy Improvement", Research Report of Nagano Prefecture General Industrial Technology Center, Oct. 30, 2015, No. 10, p. 51-53.

Written Opinion of the International Searching Authority, issued in PCT/JP2017/003710, PCT/ISA/237, dated May 9, 2017.

Japanese Decision to Grant a Patent (including an English translation thereof) issued in the corresponding Japanese Patent Application No. 2016-021212 dated Dec. 5, 2017.

Japanese Decision to Grant a Patent (including an English translation thereof) issued in the corresponding Japanese Patent Application No. 2017-104724 dated Oct. 3, 2017.

An English translation of JP 2004-101465 A, published on Apr. 2, 2004.

An English translation of JP 2012-111994 A, published on Jun. 14, 2012.

Chinese First Office Action (including an English translation thereof) issued in the corresponding Chinese Patent Application No. 201780009419.5 dated Jan. 24, 2019.

Chinese Second Office Action (including an English translation thereof) issued in the corresponding Chinese Patent Application No. 201780009419.5 dated Jul. 31, 2019.

Jiang, "Popular Speech on Tolerance between Shape and Position," New Times Press, Dec. 1982, pp. 101-103 (11 pages total; including cover page, introduction page, and an English translation thereof).

Korean Notice of Final Rejection (including an English translation thereof) issued in the corresponding Korean Patent Application No. 10-2018-7025229 dated Mar. 13, 2019.

Korean Written Opinion (including an English translation thereof) issued in the corresponding Korean Patent Application No. 10-2018-7025229 dated Dec. 3, 2018.

* cited by examiner (A)  (B)

(C)  (D)

CYLINDRICAL TARGET PRODUCTION METHOD AND CYLINDRICAL TARGET

TECHNICAL FIELD

The present invention relates to a process for producing a cylindrical target to be used for deposition by a sputtering method and a cylindrical target.

BACKGROUND ART

Conventionally, planar targets are used for deposition by a sputtering method. However, in recent years, cylindrical targets, such as those mentioned in Patent Documents 1 to 3, have been used because of their excellent usability. For instance, an aluminum target used as the wiring material for liquid crystal displays (LCDs) or the like is usually cylindrical in shape with a length of 1,000 to 3,000 mm. A cylindrical target is used in a deposition method that involves sputtering while rotating the target. A plurality of cylindrical targets is usually vertically installed as a set in a sputtering apparatus.

If such kind of a cylindrical target has distortion, abnormal discharge is likely to occur during sputtering, or the thickness of a deposited film will become uneven. In general, most cylindrical targets are long, and hence distortion, particularly in the longitudinal direction of the target, is problematic. If any distortion occurs in the longitudinal direction of even one of the plurality of cylindrical targets, malfunction of the cylindrical target could occur due to the contact of the cylindrical target with a magnet, which has been inserted into the cylindrical target, or abnormal discharge could be caused by local approach or contact between the cylindrical target and its peripheral member, such as a shield, attached to an outer part of the cylindrical target. Furthermore, the cylindrical target is used while being rotated as mentioned above. Because of this, if the cylindrical target has distortion in the longitudinal direction, the distance between the cylindrical target and a substrate on which the film is deposited becomes uneven. This would make the thickness of the deposited film uneven or could lead to the exertion of a load on a connection portion that lies between the cylindrical target and the sputtering apparatus, causing damage to or failure of the sputtering apparatus.

When a large-sized cylindrical target having a length exceeding 1 m is used in a sputtering apparatus, normally, not one, but three to twenty cylindrical targets are used as a set. However, the presence of distortion in even one target of the target set in the longitudinal direction would lead to the malfunction, abnormal discharge, or uneven deposition, as mentioned above. In practice, cylindrical targets all of which have no distortion in the longitudinal direction cannot be prepared as a set.

PRIOR ART DOCUMENTS

Patent Documents

Patent Document 1: JP 2013-57112 A1

Patent Document 2: JP 2013-204052 A1

Patent Document 3: JP 2014-105383 A1

DISCLOSURE OF THE INVENTION

Problems to be Solved by the Invention

It is an object of the present invention to provide a process for producing a cylindrical target which has almost no distortion in the longitudinal direction.

Means for Solving the Problems

The inventors of the present invention have intensively studied to solve the above-mentioned problems and found solving means including the following elements, thus conceiving the present invention.

(1) A process for producing a cylindrical target, which comprises the steps of: processing a target material into a cylindrical shape; providing, with the target material processed into the cylindrical shape, an adapter for attachment to a sputtering apparatus; and measuring a straightness in a longitudinal direction of an appearance of the target material having the adapter to confirm whether the straightness of the target material having the adapter is within a predetermined range.

(2) The process according to the above-mentioned (1), further comprising the step of: correcting the straightness in the longitudinal direction of the appearance of the target material having the adapter to have the straightness of the target material having the adapter within the predetermined range when the straightness of the target material having the adapter is outside the predetermined range.

(3) The process according to the above-mentioned (2), wherein the correction of the straightness is performed applying a cutting process or a hammering process to the target material having the adapter.

(4) The process according to any one of the above-mentioned (1) to (3), wherein the step of providing the adapter is performed joining the adapter with at least one end part of the target material processed into the cylindrical shape.

(5) The process according to any one of the above-mentioned (1) to (3), wherein the step of providing the adapter is performed forming an adapter portion in at least one end part of the target material processed into the cylindrical shape.

(6) The process according to any one of the above-mentioned (1) to (3), wherein the step of providing the adapter is performed inserting a backing tube into a hollow portion of the target material processed into the cylindrical shape.

(7) The process according to any one of the above-mentioned (1) to (6), wherein the measurement of the straightness in the longitudinal direction of the appearance of the target material is performed installing the target material having the adapter in a vertical direction, followed by using a dial gauge while rotating the target material having the adapter.

(8) The process according to the above-mentioned (7), wherein the dial gauge is provided at a position in a vicinity of an upper end part of the target material having the adapter.

(9) The process according to any one of the above-mentioned (1) to (8), wherein the target material is at least one metal selected from the group consisting of aluminum, silver, copper, titanium, and molybdenum.

(10) A cylindrical target set comprising, as one set, a plurality of cylindrical targets in which a straightness in a longitudinal direction of an appearance of each of the cylindrical targets is 2 mm or less.

(11) The cylindrical target set according to the above-mentioned (10), having a length of 700 mm or more.

(12) The cylindrical target set according to the above-mentioned (10) or (11), wherein the target material is at least one metal selected from the group consisting of aluminum, silver, copper, titanium, and molybdenum.

(13) A method for measuring a straightness of a target material produced into a cylindrical shape and constituting a cylindrical target, the method comprising the step of: inserting a member into the target material processed into the cylindrical shape, from one end to the other end thereof, the member having a diameter substantially equal to an inner diameter of the target material processed into the cylindrical shape.

(14) A measurement device for measuring a straightness in a longitudinal direction of an appearance of a target material having an adapter, the measurement device comprising: a fixing portion for installing the target material having the adapter in a vertical direction and rotating the target material; and a measurement portion capable of adjusting a position of a dial gauge to bring the dial gauge into contact with a circumferential surface of the target material having the adapter.

(15) The measurement device according to the above-mentioned (14), wherein the dial gauge is provided at a position in a vicinity of an upper end part of the target material having the adapter.

(16) A cylindrical target comprising a target material with a flange and a cap welded thereto, the cylindrical target having a straightness in a longitudinal direction of an appearance thereof of 2 mm or less.

(17) The cylindrical target according to the above-mentioned (16), which has a length of 700 mm or more.

(18) The cylindrical target according to the above-mentioned (16) or (17), wherein the target material is at least one metal selected from the group consisting of aluminum, silver, copper, titanium, and molybdenum.

Effects of the Invention

According to the present invention, the cylindrical target having almost no distortion in the longitudinal direction can be produced. Furthermore, the cylindrical target obtained by the process of the present invention has almost no distortion, and a local load is not applied to the flange even when the cylindrical target is installed on the sputtering apparatus. As a result, a load on the sputtering apparatus can be reduced and the durability of the sputtering apparatus can be improved.

BRIEF DESCRIPTION OF THE DRAWINGS

FIG. 2(A) shows the form of the target material having the adapter (flange) fixed on one end thereof and a cap fixed on the other end thereof.

FIG. 2(B) shows the form of the target material having adapters fixed on both ends thereof. FIG. 2(C) shows the form of the target material processed into a cylindrical shape and having both end parts thereof formed into adapter portions.

FIG. 2(D) shows the form of the target material processed into a cylindrical shape having a hollow portion into which a backing tube is inserted and fixed.

MODE FOR CARRYING OUT THE INVENTION

A process for producing a cylindrical target according to the present invention includes the following first to third steps. Each step will be described in detail below based on the flowchart shown in FIG. 1.

First step: Step of processing a target material into a cylindrical shape

Second step: Step of providing, with the target material processed into the cylindrical shape, an adapter for attachment to a sputtering apparatus Third step: Step of measuring a straightness in a longitudinal direction of an appearance of the target material having the adapter to confirm whether the straightness of the target material having the adapter is within a predetermined range.

(First Step)

The target material used in the process according to the present invention is not particularly limited as long as it is normally used for the deposition by the sputtering method. Examples of such a target material include aluminum, silver, copper, titanium, molybdenum, tin-doped indium oxide (ITO), aluminum-doped zinc oxide (AZO), gallium-doped zinc oxide (GZO), titanium-doped zinc oxide, and In—Ga—Zn-based complex oxide (IGZO). The target material may be an alloy containing at least one of aluminum, silver, copper, titanium, and molybdenum. Among these, aluminum or copper is preferred.

In the process of the present invention, the target material is processed into the cylindrical shape. A method for processing the target material into the cylindrical shape is not particularly limited. In the case of a metal-based target material, for example, a columnar metal-based target material may be subjected to an extrusion process or pierced at its center part to be processed into a cylindrical shape. Alternatively, a metal-based target material may be molded into a cylindrical shape by casting. On the other hand, in the case of a sintered body-based target material made of an oxide or a high-melting point metal, for example, a columnar target material may be subjected to an extrusion process or pierced at its center part to be processed into a cylindrical shape. Alternatively, a sintered body-based target material may be charged into a mold having a cylindrical shape and then sintered. If unevenness or waviness exists on a surface of the processed cylindrical target material, a cutting process or a grinding process is preferably performed for trimming the surface.

Figure 1:
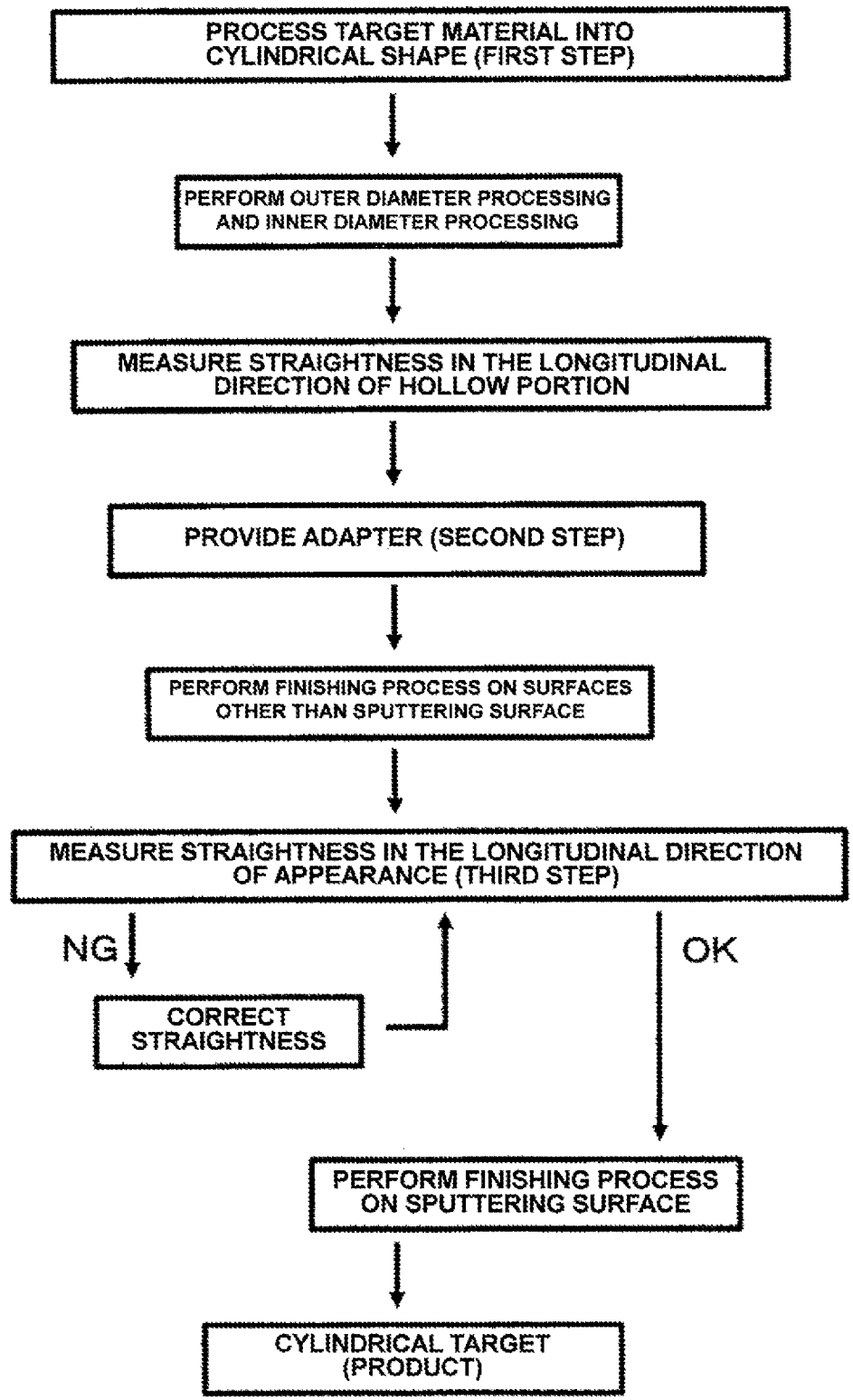
FIG. 1 is a flowchart showing a process for producing a cylindrical target according to an embodiment of the present invention.

The size of the target material processed into the cylindrical shape is not particularly limited. Usually, the length of the cylindrical target material is 700 to 4,000 mm, and preferably 700 to 3,000 mm; the outer diameter thereof is 150 to 180 mm; and the inner diameter thereof is about 100 to 140 mm. As shown in FIG. 1, the target material processed into the cylindrical shape is subjected to outer diameter processing and/or inner diameter processing as necessary. The outer diameter processing and the inner diameter processing are a general processing to be performed on a target material, and examples thereof include a cutting process, an anodizing process, a corrosion prevention process, and the like. Furthermore, at least one end part of the target material processed into the cylindrical shape is subjected to a stepping process or the like for forming a step portion to fix an adapter to be mentioned later as necessary. Moreover, the straightness in the longitudinal direction of the appearance of the target material may be measured after the target material is processed into the cylindrical shape as necessary. If there is a large distortion at the time of processing the target material into the cylindrical shape, the process may further include a step of correcting the straightness of the target material.

As shown in FIG. 1, the straightness in the longitudinal direction of a hollow portion is measured as necessary in a target material processed into the cylindrical shape. Setting the straightness of the hollow portion within the predetermined range, prevented are the malfunction of the cylindrical target due to the contact of a magnet with the hollow portion in the cylindrical target, as well as the generation of defective properties of sputtering due to uneven thickness of the target material. The method for measuring the straightness in the longitudinal direction of the hollow portion is not particularly limited. For example, the straightness can be measured as follow.

For example, the method for measuring the straightness in the longitudinal direction of the hollow portion is a method in which a member, such as a disc, with a diameter substantially equal to the inner diameter of the target material processed into the cylindrical shape (preferably, smaller than the inner diameter by approximately 0.1 to 5%), is inserted into the cylindrical target material from one end to the other end thereof. Here, the diameter of the disc may be adjusted depending on the desired straightness. For example, as the diameter of the disc is set closer to the inner diameter of the target material processed into the cylindrical shape, a clearance between the disc and the inner peripheral surface of the target material processed into the cylindrical shape becomes narrower, which means the more straightness is required of the target material.

If the disc is smoothly inserted into the cylindrical target material from one end to the other end thereof without being stuck, the cylindrical target material can be determined to have no distortion. In contrast, if the disc is stuck halfway and stops moving, the hollow portion can be determined not to be straight (to be distorted). In case where the disc is stuck halfway and does not move any more, a process (for example, a cutting process, a hammering process, or the like) for correcting the straightness of the inner peripheral surface of the target material processed into the cylindrical shape only needs to be performed.

(Second Step)

After performing the above-mentioned outer diameter processing and inner diameter processing and measurement of the straightness in the longitudinal direction of the hollow portion as necessary, the target material processed into the cylindrical shape is provided with an adapter (joint) for attaching the target material to a sputtering apparatus. Examples of the adapter include a flange, an adapter ring, a backing tube, and the like. The adapter is not particularly limited. A cylindrical target support member having an adapter portion, such as the backing tube, may be inserted into the hollow portion of the cylindrical target material, to provide an attachment portion for attaching the target material onto the sputtering apparatus. The backing tube is used to support the cylindrical target or to cool the cylindrical target by flowing water through the backing tube when the cylindrical target is installed on the sputtering apparatus. Alternatively, in addition to the use of these members, an adapter portion formed by performing shaping on at least one end part of the cylindrical target material may be used as the adapter.

Various forms of the target material having the adapter are shown in FIGS. 2(A) to 2(D).

Figure 2:
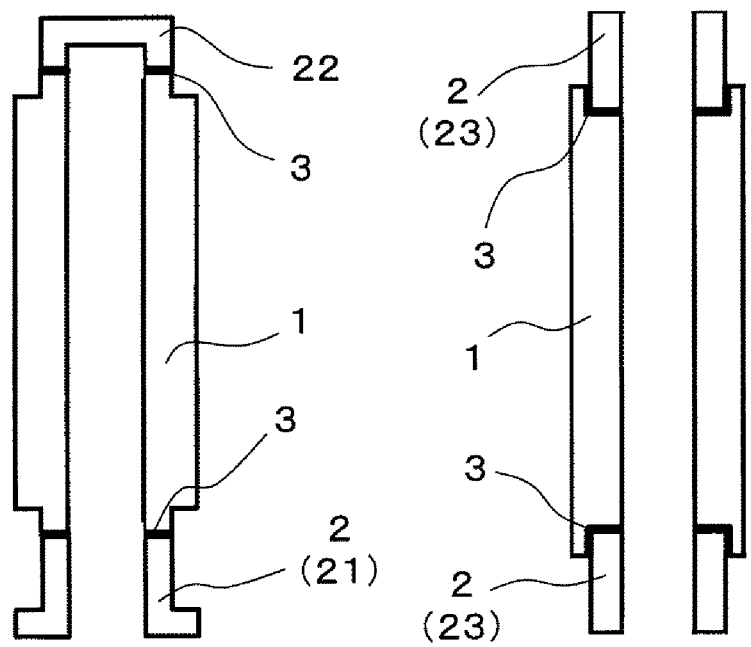
FIG. 2 is a schematic diagram showing various forms of a target material that has an adapter.
Figure 2:
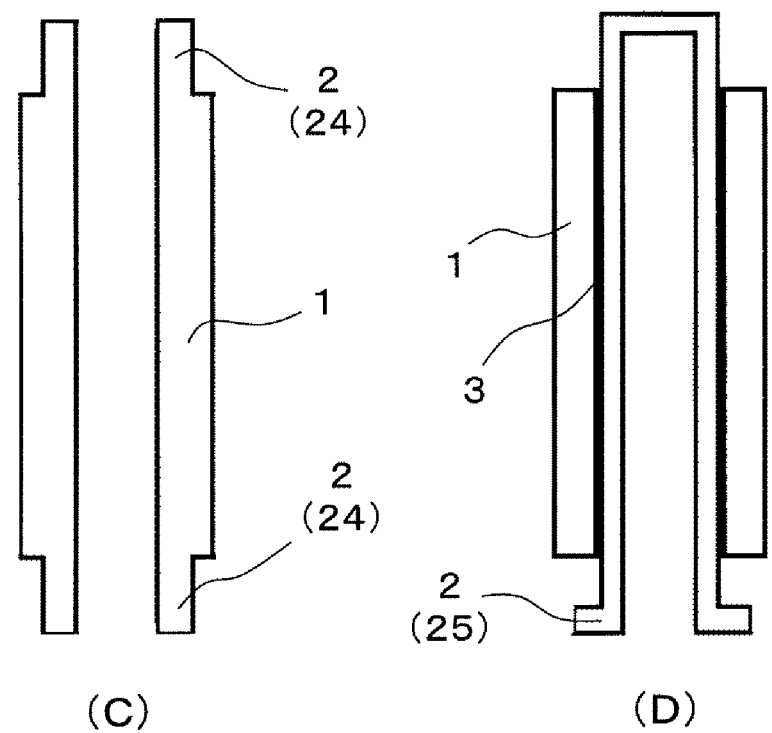

FIG. 2(A) shows a form of a target material 1 processed into the cylindrical shape and having a flange 21 fixed as an adapter 2 on one end part thereof and a cap 22 fixed on the other end part thereof. That is, the flange 21 and the cap 22 are fixed to fixing portions 3. A method for fixing the flange 21 and the cap 22 is not particularly limited, and examples thereof include weldings, such as tungsten-inert gas welding (TIG welding), electron beam welding (EB welding), metal inert gas welding (MIG welding), and laser welding, friction stir joining and brazing. FIG. 2(B) shows the form of the target material 1 processed into the cylindrical shape and having adapter rings 23 fixed as the adapter 2 on both end parts thereof. That is, the adapter rings 23 are fixed to the fixing portions 3. A method for fixing adapter rings 23 to the target material 1 is not also particularly limited, and examples thereof include the above-mentioned welding and friction stir joining.

FIG. 2(C) shows a form of the target material 1 processed into the cylindrical shape and having both end parts thereof formed as the adapter 2 into adapter portions 24. A method for forming the adapter portions 24 is not particularly limited, and the adapter portions 24 are preferably integrally formed with the target material when processing the target material 1 into the cylindrical shape.

FIG. 2(D) shows a form in which a backing tube 25 is inserted as the adapter 2 into a hollow portion of the target material 1 processed into the cylindrical shape and then fixed to a fixing portion 3. A method for fixing the backing tube 25 is not particularly limited, an example thereof includes solder joining. Since the backing tube 25 may be distorted due to heating at the time of solder joining, preferably the straightness in the longitudinal direction of the appearance of the target material 1 is measured after the joining of the backing tube, and then the end parts of the target material are corrected by a cutting process. When using the backing tube 25, the insertion of the backing tube 25 into the cylindrical target material 1 becomes difficult if the hollow portion of the target material 1 processed into the cylindrical shape has any distortion. As a result, in the case of using the backing tube 25, the straightness in the longitudinal direction of the hollow portion in the target material 1, processed into the cylindrical shape, is preferably measured as mentioned above.

Thereafter, the target material having the adapter(s) may be subjected to a finishing process to be converted into a form close to the final product. In the finishing step, parts other than a sputtering surface of the target material are preferably subjected to the finishing process, taking into consideration of the risk of dents or flaws generated on the sputtering surface and the improvement in the measurement accuracy of the straightness in a subsequent step. An example of the finishing process includes a cutting process with a long lathe.

(Third Step)

Next, it is confirmed whether the target material having the adapter(s) obtained in the second step has a predetermined straightness. To this end, the straightness in the longitudinal direction of the appearance of the target material having the adapter(s) is measured. A method for measuring the straightness in the longitudinal direction of the appearance of the target material is not particularly limited, and examples of the method include the following methods (1) to (7) below:

(1) a method for measuring deviations of a target material with an adapter at several sites in its circumferential direction with a dial gauge, setting the bottom at an end part of the target material having the adapter and installing the target material in the vertical direction;

(2) a method for measuring a clearance between a lowermost outer peripheral surface of the target material having the adapter and a yarn (weight), setting the bottom at an end part of the target material having the adapter, installing the target material in the vertical direction, and hanging the yarn with the weight attached to the uppermost outer peripheral surface of the target material;

(3) a method for measuring a warp of the target material using an L-shaped ruler or a laser beam, instead of the dial gauge, when performing the method (1);

(4) a method for measuring a warp of a target material having an adapter, placing the target material on a horizontal platform and using a gap gauge;

(5) a method for measuring a warp of a target material having an adapter, taking an isometric photograph (e.g., radiograph) of the target material and using a ruler;

(6) a method for measuring deviations of a target material having an adapter at several sites in its circumferential direction, installing the target material in the horizontal direction and using a dial gauge; and (7) a method for measuring a warp of a target material having an adapter, contacting a material having high-accuracy straightness, such as a ruler or a straight edge, with the target material, and using a gap gauge.

Among these methods mentioned in (1) to (7), the method (1) using the dial gauge is preferred from the viewpoint of simplicity of the measurement method. Since this measurement method measures the straightness of the target material, installing the cylindrical target in the vertical direction in the same manner as when the cylindrical target is sputtered, the straightness can be confirmed with higher accuracy. The outline of the measurement method mentioned as the method (1) will be described. First, the target material having the adapter is installed in the vertical direction, setting the bottom at the end part thereof having the adapter, and is then fixed to a fixing portion. The fixing portion is configured to be capable of rotating the target material having the adapter in the circumferential direction. An inspection jig includes a dial gauge at a position in the vicinity of the upper end part of the target material having the adapter.

Then, the position of the dial gauge is adjusted to measure a runout at a part of the target material having the adapter, specifically, a part of the target material located approximately 0 to 100 mm, preferably approximately 1 to 50 mm, and more preferably approximately 5 to 20 mm below the uppermost part of the target material. By rotating the target material having the adapter one turn, the position of the target material with the minimum runout width is confirmed, and then the confirmed position is defined as the reference (the dial gauge is set at 0 mm).

Then, the runout widths at several sites other than the reference position of the target material are measured, for example, at three sites every 90 degrees from the reference position. As the maximum runout width value is larger, the distortion could be determined to be larger. In all measurement positions, desirably every runout width is 0 mm, but normally, if the maximum runout width value is approximately 2 mm (i.e., if the straightness in the longitudinal direction of the appearance of the target material is 2 mm or less), it can be considered that the target material has almost no distortion in the longitudinal direction. The runout width is preferably 1.8 mm or less, and more preferably 1.5 mm or less.

When the straightness in the longitudinal direction of the appearance of the target material having the adapter is set within a predetermined range, the cylindrical target can be obtained, but may have its sputtering surface subjected to a finishing process again. An example of the finishing process of the sputtering surface includes a cutting process, by which the outer peripheral surface of the target material is cut to have a desired thickness. Thereafter, the sputtering surface may be cleaned using an organic solvent, such as ethanol, methanol, isopropyl alcohol, acetone, hexane, toluene, xylene, methylene chloride, ethyl acetate and a commercially available cleaning agent, as necessary.

If the straightness in the longitudinal direction of the appearance of the target material having the adapter is outside the predetermined range, the target material having the adapter undergoes the step of correcting the straightness in the longitudinal direction of the appearance thereof. This correction is performed by a cutting process with a lathe, a hammering process, or the like. FIGS. 3(A) to 3(D) show one embodiment of a method for correcting the straightness in the longitudinal direction of the appearance of a target material, to which a flange is attached. The same members as those in FIG. 2(A) are denoted by the same reference characters, and a detailed description thereof is omitted.

Figure 3:
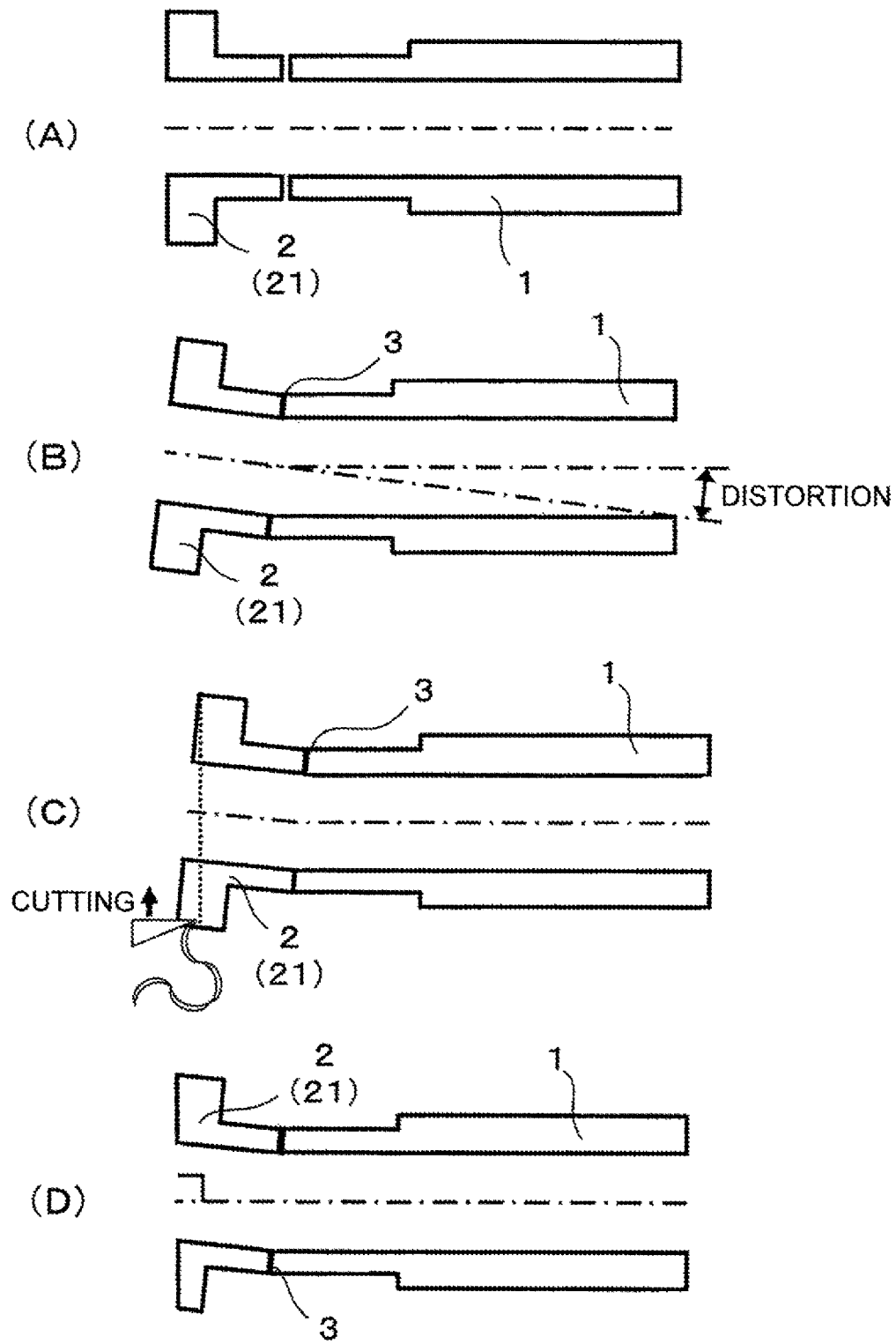
FIGS. 3(A) to 3(D) are explanatory diagrams for explaining an embodiment of a method for correcting the straightness of a target material in a longitudinal direction of its appearance with the flange attached thereto.

FIG. 3(A) shows the state of the target material 1 processed into the cylindrical shape, before the flange 21 is attached to the target material 1. When the flange 21 is fixed to the target material 1 processed into the cylindrical shape by the above-mentioned welding, friction stir joining, or the like, as shown in FIG. 3(B), the target material 1 may be bent at the fixing portion 3 to cause distortion there. As the length of the target material is larger, there becomes a larger possibility that the size of the distortion or the straightness of the target material falls outside the predetermined range. In order to correct this distortion, as shown in FIG. 3, the end surface of the flange 21 is cut, for example, by a lathing process. As shown in FIG. 3(D), when the end surface of the flange 21 is corrected to be oriented vertically relative to the longitudinal direction of the target material 1, processed into the cylindrical shape, the distortion is eliminated or reduced to a slight extent. As a result, the cylindrical target finally obtained has no runout or a slight runout that does not cause any trouble when being rotated.

After this correction process, the straightness in the longitudinal direction of the appearance of the target material is measured again, and if the measured straightness is within the predetermined range, the sputtering surface is subjected to the finishing process as mentioned above. If the measured straightness is outside the range, the correction process is repeatedly performed until the straightness falls within the predetermined range. Further, as shown in FIG. 2(B), when adapters are provided at both ends of the target material, the target material is installed in the vertical direction setting the bottom at one end thereof, and then the straightness in the longitudinal direction of the appearance of the target material is measured as mentioned above. Subsequently, a correction process is preferably performed as necessary, and then the straightness in the longitudinal direction of the appearance of the target material is measured by setting the bottom at the other end thereof, followed by another correction process as necessary.

By such a method as mentioned above, the present invention can produce the cylindrical target having almost no distortion in the longitudinal direction. Usually, the length of a cylindrical target is 4,000 mm or less. Particularly, the present invention can provide an elongated cylindrical target without almost having any distortion in the longitudinal direction even when the length of the target is 2,000 mm or more, 2,500 mm or more, or even 2,900 mm or more. Accordingly, the obtained cylindrical target is less likely to malfunction due to contact with a magnet inserted into the cylindrical target. Alternatively, the cylindrical target can suppress the local approach or contact with a peripheral member, such as a shield existing in the surroundings of the cylindrical target, whereby abnormal discharge is not likely to occur in the cylindrical target. In addition, since the cylindrical target has almost no distortion, the cylindrical target has no runout or a slight runout that does not cause any trouble when being rotated. As a result, the distance between the cylindrical target and a substrate on which a film is deposited becomes constant, and the thickness of the deposited film can be formed uniformly. Furthermore, the cylindrical target has almost no distortion in the longitudinal direction even when installed on the sputtering apparatus. Thus, a local load is not applied to the connection portion between the cylindrical target and the sputtering apparatus. Consequently, the load on the sputtering apparatus is reduced, and the sputtering apparatus can be improved in durability.

In sputtering, a plurality of cylindrical targets are usually installed in a sputtering apparatus. Accordingly, a plurality of cylindrical targets may be shipped as a cylindrical target set. Normally, three to twenty targets are shipped as a set of cylindrical targets (e.g., three, eight, nine, or twelve targets).

As mentioned above, the cylindrical target obtained by the process of the present invention has almost no distortion (i.e., the straightness in the longitudinal direction of the appearance of the target is 2 mm or less). Thus, a plurality of the cylindrical targets can be installed as one set on the sputtering apparatus. If even one of the cylindrical targets in the sputtering apparatus has distortion, abnormal discharge or application of a load on a connection portion with the sputtering apparatus tends to occur. However, in the process of the present invention, the cylindrical targets with almost no distortion can be prepared according to the number of targets installed in the sputtering apparatus. Therefore, a plurality of cylindrical targets obtained by the process of the present invention can be formed into one set, which can be easily shipped as a cylindrical target set.

EXAMPLES

The present invention will be described in detail below by Examples, but the present invention is not limited to these Examples.

Example 1

First, aluminum having high purity (99.999%) was used as a target material. This target material (aluminum) was processed into a cylindrical shape. The target material processed into the cylindrical shape had an outer diameter of 165 mm, an inner diameter of 126 mm, and a length of 2,750 mm.

Then, the straightness in the longitudinal direction of a hollow portion formed in the target material processed into the cylindrical shape (inner diameter reference) was measured. The measurement method is as follows. First, a disc (of 110 mm in height) made of aluminum was prepared. The disc had a diameter smaller by 0.2 mm than the inner diameter of the target material processed into the cylindrical shape. A rod of about 3 m in length was attached to the center of the disc, and the disc was then inserted into the hollow portion of the target material, processed into the cylindrical shape, from one end of the target material processed into the cylindrical shape. If the disc was pushed toward the other end of the cylindrical target material and could be smoothly inserted completely thereinto without being stuck halfway, the target material was rated as pass. If the disc was stuck halfway and stopped moving, the inner peripheral surface of the target material processed into the cylindrical shape was subjected to the cutting process, and then the disc was inserted again into the processed target material. This step was repeatedly performed until the disc was smoothly inserted into the target material from one end to the other end thereof without being stuck at all.

Then, in order to weld a flange made of an aluminum alloy to one end of the target material processed into the cylindrical shape and a cap made of an aluminum alloy to the other end thereof, each of both ends of the hollow-shaped target material was subjected to a cutting process to match the shape of the corresponding flange or cap. Subsequently, the flange and cap were welded to the respective ends of the target material by TIG-welding, and a target material of 3,000 mm in entire length with the flange and cap welded thereto was obtained.

Examples 2 to 12

In the same manner as in Example 1, target materials, each having an entire length of 3,000 mm with a flange and a cap welded thereto, were obtained.

Figure 4:
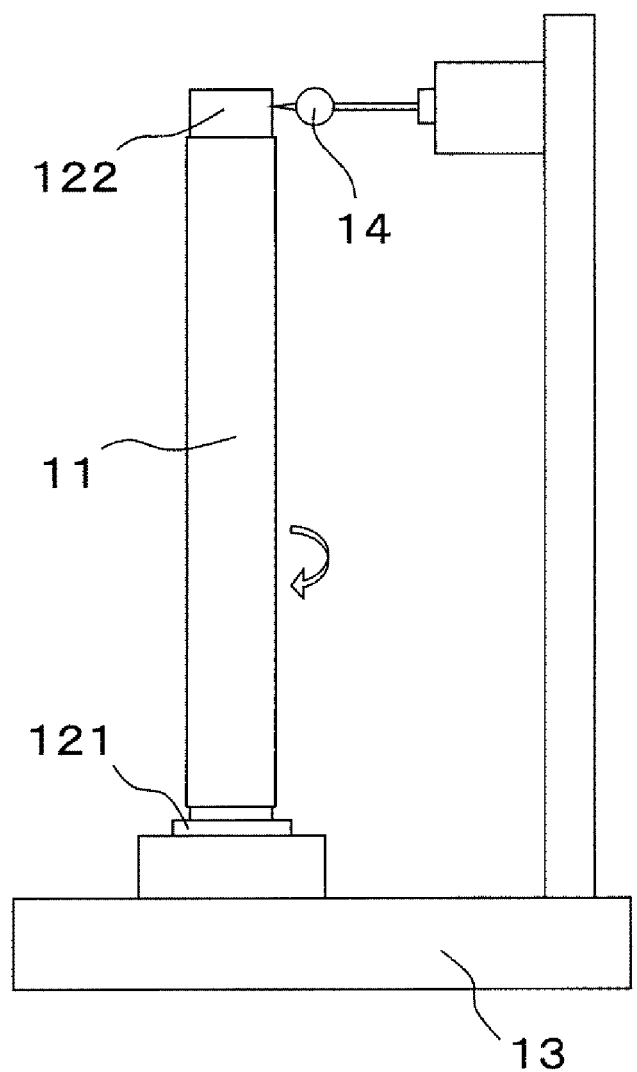
FIG. 4 is an explanatory diagram for explaining a method for measuring the straightness of the appearance of the target material in the longitudinal direction thereof, which was performed in Examples.

Regarding the appearance (reference outer diameter) of the target materials, each having the flange and cap welded thereto, which were obtained in Examples 1 to 12, the straightness in the longitudinal direction of the appearance of each target material was measured by setting, at the bottom, the end part of the target material having the flange. The straightness was measured using a dial gauge as shown in an explanatory diagram of FIG. 4. As shown in FIG. 4, a target material 11 processed into a cylindrical shape with a flange 121 and a cap 122 attached thereto was installed on an inspection jig 13. The target material 11 processed into the cylindrical shape was fixed to the inspection jig 13 with the flange 121. The inspection jig 13 was configured to rotate the target material 11 processed into the cylindrical shape. The inspection jig 13 was provided with a dial gauge 14. The dial gauge 14 was adjusted to touch the position away from an upper end of the cap 122 by 10 mm.

First, the target material 11 processed into the cylindrical shape was rotated once to confirm the position of the minimum runout width. The position of the minimum runout width was defined as the reference position (point A), for which the dial gauge 14 was set at 0 mm. Then, a runout value of the position (point B) at which the target material 11 processed into the cylindrical shape was rotated clockwise by 90 degrees from the reference position was measured by the dial gauge 14. In addition, a runout value of the position (point C) at which the target material was further rotated clockwise by 90 degrees from point B, as well as a runout value of the position (point D) at which the target material was further rotated clockwise by 90 degrees from point C were measured by the dial gauge 14. Among the measured values at points B to D, the target material having the maximum value of 2 mm or less (the runout value of 2 mm or less) was rated as pass.

The measurement results are shown in Table 1. As shown in Table 1, the target material, with the flange and cap welded thereto, obtained in each of Examples 2, 3, and 5 had a maximum value of 2 mm or less. The target material, with the flange and cap welded thereto, obtained in each of Examples 1, 4 and 6 to 12 had a maximum value exceeding 2 mm. Here, the flange 121 was subjected to a lathing process to cut and correct a part of the end surface of the flange 121 (the contact surface with the inspection jig 13). After the correction, the straightness in the longitudinal direction of each target material was measured again in the same manner. The measurement results are shown in Table 1. As shown in Table 1, the target material, with the flange and cap welded thereto, obtained in each of Examples 1, 4, and 6 to 12 eventually had the maximum value of 2 mm or less.

Example 14

First, aluminum (target material) of Lot No., different from aluminum used in Example 1, was used. This target material (aluminum) was processed into a cylindrical shape. The target material processed into the cylindrical shape had an outer diameter of 165 mm, an inner diameter of 132 mm, and a length of 2,750 mm.

A backing tube (with an outer diameter of 130 mm, an inner diameter of 122 mm, and a length of 3,000 mm) made of SUS304 with a cap and a flange was inserted into the hollow portion of the target material processed into the cylindrical shape. The backing tube was joined with the target material by soldering using indium so that the cap and flange emerged by 100 mm and 150 mm from both ends of

TABLE 1

| | | Measurement results before correction (mm) | | | | Maximum value (runout value) (mm) | Measurement results after correction (mm) | | | | Maximum value (runout value) (mm) |
|---|---|---|---|---|---|---|---|---|---|---|---|
| | | Point A | Point B | Point C | Point D | | Point A | Point B | Point C | Point D | |
| Example | 1 | 0.00 | 0.90 | 2.50 | 1.50 | 2.50 | 0.00 | 0.60 | 1.20 | 0.70 | 1.20 |
| | 2 | 0.00 | 0.95 | 1.95 | 0.70 | 1.95 | — | — | — | — | — |
| | 3 | 0.00 | 0.40 | 1.60 | 1.00 | 1.60 | — | — | — | — | — |
| | 4 | 0.00 | 1.40 | 3.65 | 2.00 | 3.65 | 0.00 | 0.70 | 0.80 | 0.30 | 0.80 |
| | 5 | 0.00 | 1.10 | 1.80 | 1.00 | 1.80 | — | — | — | — | — |
| | 6 | 0.00 | 0.95 | 2.30 | 1.60 | 2.30 | 0.00 | 0.70 | 1.10 | 0.40 | 1.10 |
| | 7 | 0.00 | 2.00 | 3.80 | 1.80 | 3.80 | 0.00 | 0.70 | 1.35 | 0.70 | 1.35 |
| | 8 | 0.00 | 2.50 | 8.00 | 4.70 | 8.00 | 0.00 | 0.50 | 1.25 | 0.70 | 1.25 |
| | 9 | 0.00 | 2.20 | 5.20 | 3.80 | 5.20 | 0.00 | 0.40 | 1.00 | 0.60 | 1.00 |
| | 10 | 0.00 | 4.90 | 8.40 | 5.10 | 8.40 | 0.00 | 0.60 | 1.70 | 0.70 | 1.70 |
| | 11 | 0.00 | 2.90 | 4.90 | 2.00 | 4.90 | 0.00 | 0.70 | 1.50 | 0.60 | 1.50 |
| | 12 | 0.00 | 2.00 | 3.30 | 1.10 | 3.30 | 0.00 | 0.70 | 1.90 | 0.80 | 1.90 |

As shown in Table 1, it is found that the target material, with the flange and cap welded thereto, finally obtained in each of Examples 1 to 12 had a maximum runout value of 2 mm or less, and hence hardly had distortion. Then, the target material, with the flange and cap welded thereto, obtained in each of Examples 1 to 12 had its sputtering surface subjected to a finishing process (cutting process). Thereafter, the finished target material was washed with an ethanol to obtain a cylindrical target.

Example 13

First, oxygen-free copper (99.99%) was used as a target material. The target material (oxygen-free copper) was processed into a cylindrical shape. The target material processed into the cylindrical shape had an outer diameter of 165 mm, an inner diameter of 126 mm, and a length of 2,750 mm. A cylindrical target of 3,000 mm in entire length was produced in the same manner as in Example 1 except for the use of the flange and cap made of the high-purity oxygen-free copper. The measurement results of the target material with the flange and cap welded thereto before and after the correction are shown in Table 2.

the target material processed into the cylindrical shape respectively. Furthermore, after the solder joining, the entire target material processed into the cylindrical shape was subjected to the latching process so as to have a predetermined dimension.

The straightness of the obtained target material of 3,000 mm in entire length was measured in the longitudinal direction in the same method as in Example 1. As a result, the straightness of the target material was confirmed to be within the predetermined range (2 mm or less). Therefore, a cylindrical target was obtained without performing a correction process. The measurement results are shown in Table 3.

Examples 15 and 16

Aluminum (target material) of Lot No., different from aluminum employed in each of Examples 1 and 14, was used. Except for this, the target material was processed into a cylindrical shape and obtained in the same manner as in Example 14.

TABLE 2

| | | Measurement results (mm) | | | | Maximum value (runout value) (mm) |
|---|---|---|---|---|---|---|
| | | Point A | Point B | Point C | Point D | |
| Example 13 | Before correction | 0.00 | 5.00 | 10.00 | 5.00 | 10.00 |
| | After correction | 0.00 | 0.30 | 0.70 | 0.40 | 0.70 |

Then, a backing tube made of SUS304 was joined to the target material by soldering in the same manner as in Example 14. Furthermore, after the solder joining, the entire target material processed into the cylindrical shape was subjected to the latching process so as to have a predetermined dimension.

The straightness of the obtained target material of 3,000 mm in entire length was measured in the longitudinal direction in the same method as in Example 1. As a result, the straightness of the target material in each of Examples 15 and 16 was confirmed to be within the predetermined range (2 mm or less). Therefore, a cylindrical target was obtained without performing a correction process. The measurement results are shown in Table 3.

TABLE 3

|  | Measurement results before correction (mm) | | | | Maximum value (runout value) (mm) |
|---|---|---|---|---|---|
|  | Point A | Point B | Point C | Point D |  |
| Example 14 | 0.00 | 0.30 | 0.60 | 0.40 | 0.60 |
| Example 15 | 0.00 | 0.40 | 0.70 | 0.30 | 0.70 |
| Example 16 | 0.00 | 0.30 | 0.80 | 0.40 | 0.80 |

Examples 17 to 19

Aluminum (target material) of Lot No., different from aluminum employed in each of Examples 1 and 14 to 16, was used. This target material (aluminum) was processed into a cylindrical shape. The target material processed into the cylindrical shape in each of Examples 17 to 19 had an outer diameter of 165 mm, an inner diameter of 126 mm, and a length of 2,200 mm.

Then, both ends of each of the target materials processed into the cylindrical shape were subjected to a cutting process so as to match the shape of an adapter ring. The adapter ring, which was a cylindrical-device installation joint made of an aluminum alloy, was welded to the cut part by TIG welding. After the welding process, the target material having the adapter rings at both ends thereof was subjected to the lathing process so as to have a predetermined dimension.

The straightness in the longitudinal direction of the obtained target material of 2,300 mm in entire length was measured in the same method as in Example 1. The straightness of each target material was measured twice, setting each end part at the bottom. As a result, the straightness of any one of the target materials was also confirmed to be within the predetermined range (2 mm or less). Accordingly, a cylindrical target was obtained from each target material without performing a correction process. The measurement results are shown in Table 4. Table 4 shows one of the two measured values that had a larger distortion in each target material.

TABLE 4

|  | Measurement results before correction (mm) | | | | Maximum value (runout value) (mm) |
|---|---|---|---|---|---|
|  | Point A | Point B | Point C | Point D |  |
| Example 17 | 0.00 | 0.60 | 1.40 | 0.80 | 1.40 |
| Example 18 | 0.00 | 0.50 | 1.00 | 0.60 | 1.00 |
| Example 19 | 0.00 | 0.30 | 0.80 | 0.40 | 0.80 |

As mentioned above, according to the process of the present invention, the cylindrical target having almost no distortion can be obtained. Therefore, the obtained cylindrical target is less likely to malfunction due to contact with a magnet inserted into the cylindrical target. Alternatively, abnormal discharge is less likely to occur due to the local approach or contact between the cylindrical target and a peripheral member, such as a shield attached to an outer part of the cylindrical target. In addition, since the cylindrical target has almost no distortion, the cylindrical target has no runout or a slight runout that does not cause any trouble when being rotated. As a result, the distance between the cylindrical target and a substrate on which a film is deposited becomes constant, thereby making the thickness of the deposited film uniform. Further, the cylindrical target has almost no distortion in the longitudinal direction even when installed on the sputtering apparatus. Thus, a local load is not applied to the connection portion between the cylindrical target and the sputtering apparatus. Consequently, the load on the sputtering apparatus is reduced, thereby making it possible to improve the durability of the sputtering apparatus.

Furthermore, a cylindrical target set, that is one set formed from the plurality of cylindrical targets can get all the cylindrical targets installed in the sputtering apparatus to have almost no distortion. As a result, this configuration can prevent abnormal discharge and application of a local load on the connection portion. Accordingly, a plurality of cylindrical targets, each obtained by the process of the present invention, can be formed into one set, which can be easily shipped as a cylindrical target set.

DESCRIPTION OF REFERENCE NUMERALS

1 Target material processed into a cylindrical shape
2 Adapter
21 Flange
22 Cap
23 Adapter ring
24 Adapter portion
25 Backing tube
3 Fixing portion
11 Target material processed into a cylindrical shape
121 Flange
122 Cap
13 Inspection jig
14 Dial gauge

The invention claimed is:
1. A cylindrical sputtering target
    which comprises at least one metal selected from the group consisting of aluminum, silver, copper, titanium, and molybdenum,
    in which an adaptor is installed, and
    in which a straightness in a longitudinal direction of an appearance is 2 mm or less,
    said straightness being defined by setting an end part having the adaptor at the bottom and fixing the cylindrical sputtering target to an inspection jig in the vertical direction, and measuring the straightness using a dial gauge at a position in the vicinity of the upper end part of the sputtering target while rotating the cylindrical sputtering target.
2. The cylindrical sputtering target according to claim 1, which has a length of 700 mm or more.
3. A cylindrical sputtering target set comprising a plurality of cylindrical sputtering targets which comprises at least one metal selected from the group consisting of aluminum, silver, copper, titanium, and molybdenum, in which an adaptor is installed, and in which a straightness in a longitudinal direction of an appearance is 2 mm or less, said straightness being defined by setting an end part having the adaptor at the bottom and fixing the cylindrical sputtering target set to an inspection jig in the vertical direction, and measuring the straightness using a dial gauge at a position in the vicinity of the upper end part of the sputtering target set while rotating the cylindrical sputtering target set.

4. The cylindrical sputtering target set according to claim 3, wherein each of the plurality of cylindrical sputtering targets has a length of 700 mm or more.

5. The cylindrical sputtering target according to claim 1, which has a length of 2000 mm or more.

6. The cylindrical sputtering target set according to claim 3, wherein each of the plurality of cylindrical sputtering targets has a length of 2000 mm or more.

* * * * *